US011619925B2

(12) United States Patent
Janicki et al.

(10) Patent No.: US 11,619,925 B2
(45) Date of Patent: Apr. 4, 2023

(54) REMOTE-PLASMA CLEAN (RPC) DIRECTIONAL-FLOW DEVICE

(71) Applicant: Lam Research Corporation, Fremont, CA (US)

(72) Inventors: Michael J. Janicki, Portland, OR (US); James Forest Lee, Damascus, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/553,686

(22) Filed: Dec. 16, 2021

(65) Prior Publication Data

US 2022/0107619 A1 Apr. 7, 2022

Related U.S. Application Data

(63) Continuation of application No. PCT/US2021/070577, filed on May 19, 2021.
(Continued)

(51) Int. Cl.
*H01J 37/32* (2006.01)
*G05B 19/4097* (2006.01)

(52) U.S. Cl.
CPC .... *G05B 19/4097* (2013.01); *H01J 37/32862* (2013.01); *G05B 2219/34479* (2013.01); *G05B 2219/45031* (2013.01)

(58) Field of Classification Search
CPC ...... G05B 19/4097; G05B 2219/34479; G05B 2219/45031; H01J 37/32862
See application file for complete search history.

(56) References Cited

U.S. PATENT DOCUMENTS 6,450,117 B1 9/2002 Murugesh et al.
2005/0199184 A1* 9/2005 Murugesh ........... C23C 16/4405
118/715
(Continued)

FOREIGN PATENT DOCUMENTS

KR 100558922 B1 3/2006
KR 100817464 B1 3/2008
(Continued)

OTHER PUBLICATIONS

International Search Report and Written Opinion issued in Application No. PCT/US2021/070577 dated Sep. 15, 2021.
(Continued)

*Primary Examiner* — Erin F Bergner
(74) *Attorney, Agent, or Firm* — Weaver Austin Villeneuve & Sampson LLP

(57) ABSTRACT

Various embodiments include apparatuses, systems, and methods for using a remote-plasma cleaning system with a directional-flow device for concurrently cleaning multiple processing stations in a processing tool used in the semiconductor and allied fields. In one example, an apparatus used to perform a remote-plasma clean (RPC) in a multi-station process chamber is disclosed and includes an RPC directional-flow device that is to be coupled between an RPC reactor and the process chamber. The RPC directional-flow device includes a number of ramped gas-diversion areas to direct at least a radical species generated by the RPC reactor to a separate one of the processing stations. An incoming cleaning-gas diversion hub is to receive the radical species and distribute at least the species substantially-uniformly to each of the of the ramped gas-diversion areas. Other apparatuses, systems, and methods are disclosed.

26 Claims, 15 Drawing Sheets

Related U.S. Application Data

(60) Provisional application No. 63/027,939, filed on May 20, 2020.

(56) References Cited

U.S. PATENT DOCUMENTS

| | | |
|---|---|---|
| 2007/0095286 A1 | 5/2007 | Baek et al. |
| 2016/0160349 A1* | 6/2016 | Cho .................... C23C 16/4412 438/22 |
| 2020/0051807 A1 | 2/2020 | Singhal et al. |
| 2020/0165726 A1* | 5/2020 | Lau ................... C23C 16/45591 |

FOREIGN PATENT DOCUMENTS

| | | |
|---|---|---|
| KR | 20080048430 A | 6/2008 |
| KR | 20080111334 A | 12/2008 |
| KR | 20110035611 A | 4/2011 |
| KR | 20140006646 A | 1/2014 |

OTHER PUBLICATIONS

KR Office Action dated Oct. 19, 2022, in Application No. KR10-2022-7001498.
KR Office Action dated Oct. 19, 2022, in Application No. KR10-2022-7001498 with English translation.

\* cited by examiner

SECTION A-A

REMOTE-PLASMA CLEAN (RPC) DIRECTIONAL-FLOW DEVICE

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

TECHNOLOGY FIELD

The disclosed subject matter is generally related to the field of cleaning processing chambers used in the semiconductor and allied fields. More specifically, the disclosed subject matter is related to using a remote-plasma cleaning system with a directional-flow device.

BACKGROUND

As is known in the art, various deposition processes are used to deposit films in forming integrated circuits and related devices by various methods including plasma-enhanced chemical vapor deposition (PECVD) and atomic-layer deposition (ALD). However, a consequence of the deposition process is that the various materials (e.g., film depositions) are not only deposited onto a substrate undergoing a process, but also on the interior surfaces of the process chambers in which the depositions occur. Consequently, films from the deposited materials are formed on the interior surfaces of the process chambers. The films continue to accumulate over time. Additionally, the films can dissolve, detach, or otherwise disperse through the process chamber causing contamination. Therefore, the accumulated films are periodically removed, by various processes known in the art, from the process chambers to avoid such contamination.

For example, FIG. 1A shows a plasma direct-cleaning system 100 of the prior art used to clean interior portions of a single process-chamber 101. FIG. 1A shows a gas-inlet port 117, connected to a gas-distribution showerhead 103. Below the gas-distribution showerhead 103 is a substrate pedestal 105 designed to hold a substrate (e.g., a wafer comprising an elemental semiconductor, such as silicon, a wafer comprising a compound semiconductor, or other substrate types known in the art) undergoing a film deposition process. The substrate pedestal 105 is pneumatically and mechanically coupled to a gate valve 107, which can be opened to exhaust 119 process gases to a pump (not shown). Various interior surfaces of the single process-chamber 101 are coated with films 111A.

During a direct-cleaning process, cleaning gases (e.g., fluorine-containing compounds such as hexafluoroethane ($C_2F_6$, also known as carbon hexafluoride) or octafluoropropane ($C_3F_8$, also known as perfluoropropane), which are often mixed with oxygen ($O_2$) as plasma etching-materials, are injected into the gas-inlet port 117. A radio-frequency (RF) generator 109 is used to produce a plasma 113 within the single process-chamber 101. Fluorine atoms are readily dissociated from the fluorine-containing compounds within the plasma 113. As is known in the art, fluorine atoms are highly electronegative and are highly reactive with many types of materials, typically forming a volatile by-product that is pumped out of the processing chamber 101 that can be removed by the pump through the exhaust 119.

FIG. 1B shows results 130 of a high-pressure clean on the interior portions of the single process-chamber 101 using the plasma direct-cleaning system 100 in accordance with FIG. 1A. Although many of the films have been reduced to thinner or non-continuous films 111B, most of the films 111A still remain. Consequently, the results 130 indicate that the process chamber 101 is incompletely cleaned.

FIG. 1C shows results 150 of a low-pressure clean on the interior portions of the single process-chamber 101 using the plasma direct-cleaning system 100 in accordance with FIG. 1A. Although most of the films 111A remaining from the high-pressure clean have been removed, thinner or non-continuous films 111B still remain. Thus, the process chamber 101 is still incompletely cleaned.

Moreover, the plasma direct-cleaning system 100 has additional disadvantages in that plasma-generated ions continuously bombard the interior surfaces of the processing chamber 101 and can cause damage to associated hardware with the ions. Additionally, as shown, the plasma direct-cleaning system 100 may not completely clean peripheral areas within the single process-chamber 101, or areas that are difficult to access such as around robotic parts such as lift pins (not shown), or within the gas-distribution showerhead 103. Further, the plasma direct-cleaning system 100 can be more difficult to implement successfully and efficiently within multi-chamber or multi-station processing tools that are becoming increasingly common in semiconductor-fabrication environments.

The information described in this section is provided to offer the skilled artisan a context for the following disclosed subject matter and should not be considered as admitted prior art.

SUMMARY

In various embodiments, the disclosed subject matter describes a an apparatus to direct radical species. The apparatus comprises a remote-plasma clean (RPC) directional-flow device that is configured to be coupled between an RPC reactor and a multi-station process chamber. The RPC directional-flow device includes multiple, ramped gas-diversion areas. Respective ones of the multiple, ramped gas-diversion areas are configured to direct at least the radical species generated by the RPC reactor to a separate one of multiple processing stations within the multi-station process chamber. A number of the ramped gas-diversion areas is at least equal to a number of the multiple processing stations. An incoming cleaning-gas diversion hub is arranged to receive at least the radical species from the RPC reactor and distribute at least the radical species substantially-uniformly to each of the multiple, ramped gas-diversion areas.

In various embodiments, the disclosed subject matter describes a directional-flow device to distribute an incoming-gas flow. The directional-flow device includes multiple, ramped gas-diversion areas. Respective ones of the multiple, ramped gas-diversion areas are arranged to direct the incoming-gas flow to a separate one of multiple processing stations within a multi-station process chamber. A number of the ramped gas-diversion areas is at least equal to a number of the multiple processing stations. An incoming-gas diversion hub is arranged to receive and split the incoming-gas flow substantially-uniformly and distribute the incoming-gas flow to at least each of the multiple ramped gas-diversion areas.

In various embodiments, the disclosed subject matter includes a remote-plasma clean (RPC) directional-flow device. The RPC directional-flow device includes multiple, ramped gas-diversion areas. Respective ones of the multiple, ramped gas-diversion areas are configured to direct at least a radical species generated by an RPC reactor to a separate one of multiple processing stations within a multi-station process chamber. A multi-ribbed wall separates each of the ramped gas-diversion areas. The multi-ribbed wall has a channel located between each multi-ribbed wall separating the ramped gas-diversion areas. An incoming cleaning-gas diversion hub is arranged to receive at least the radical species from the RPC reactor and distribute at least the radical species substantially-uniformly to each of the multiple, ramped gas-diversion areas.

DETAILED DESCRIPTION

The description that follows includes illustrative examples, devices, and apparatuses that embody various aspects of the disclosed subject matter. In the following description, for purposes of explanation, numerous specific details are set forth in order to provide an understanding of various embodiments of the inventive subject matter. It will be evident however, to those of ordinary skill in the art, that various embodiments of the disclosed subject matter may be practiced without these specific details. Further, well-known structures, materials, and techniques have not been shown in detail, so as not to obscure the various illustrated embodiments.

Various exemplary embodiments discussed herein below focus on providing more efficient cleaning of process chambers by directing a clean gas flow (or more generally, an incoming-gas flow) to each pedestal and showerhead station within a multi-station processing tool. Embodiments of the disclosed subject matter also reduce or minimize recombination of various types of cleaning compounds (e.g., oxygen ($O_2$) in which recombination is much more aggressive than, for example, nitrogen trifluoride ($NF_3$). Various embodiments may also serve to reduce or minimize heating of the spindle and indexer assembly.

Although certain types of remote-plasma cleaning (RPC) systems for interiors of process chambers have been considered in the past, the feasibility of using these RPC systems in certain situations is limited. For example, as described below, multi-chamber or multi-station systems cannot effectively use the standard RPC systems of the prior art. Nonetheless, a person of ordinary skill in the art will recognize the significant importance of various embodiments of the disclosed subject matter upon a brief review of contemporaneous RPC cleaning systems.

Figure 1A:
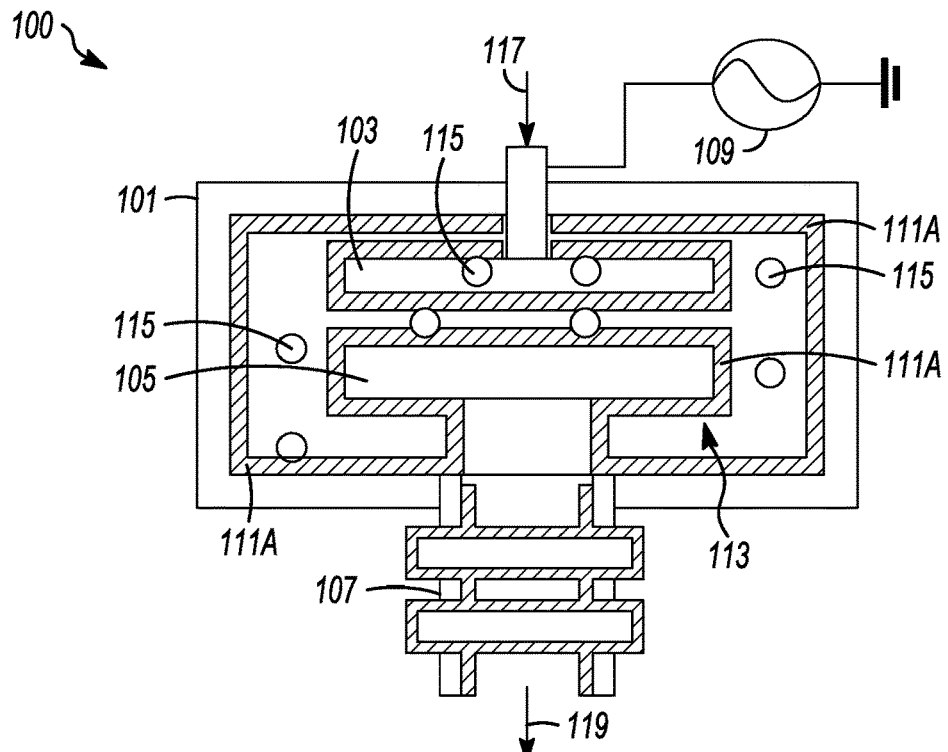
FIG. 1A shows a plasma direct-cleaning system of the prior art used to clean interior portions of a single process-chamber.
Figure 1B:
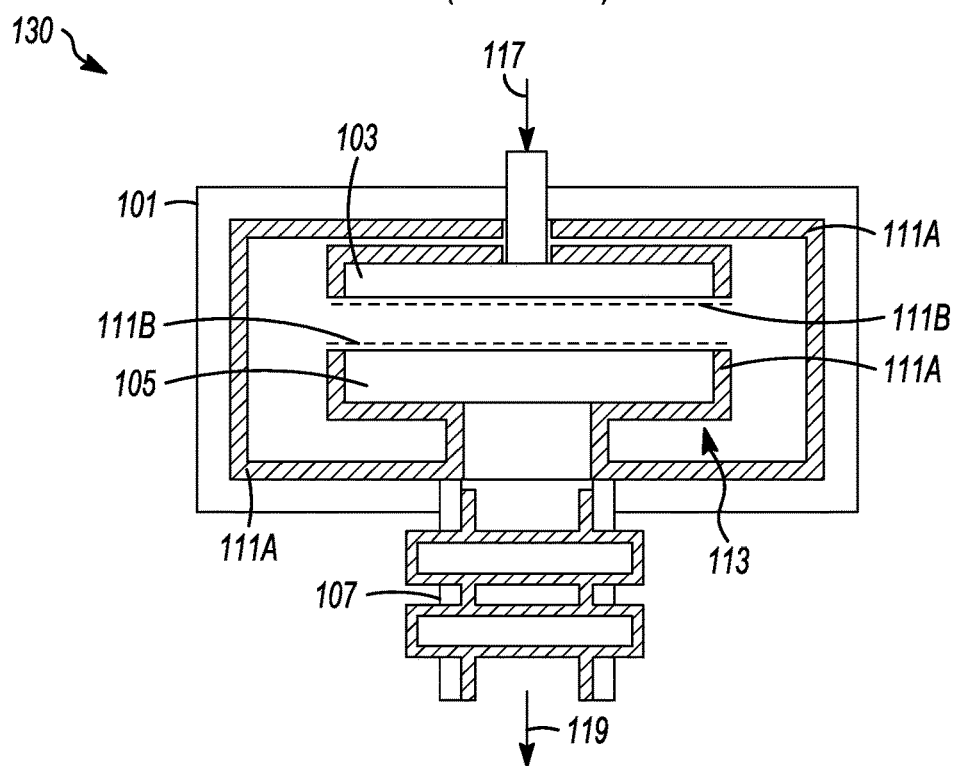
FIG. 1B shows results of a high-pressure clean on the interior portions of the single process-chamber using the plasma direct-cleaning system in accordance with FIG. 1A.
Figure 1C:
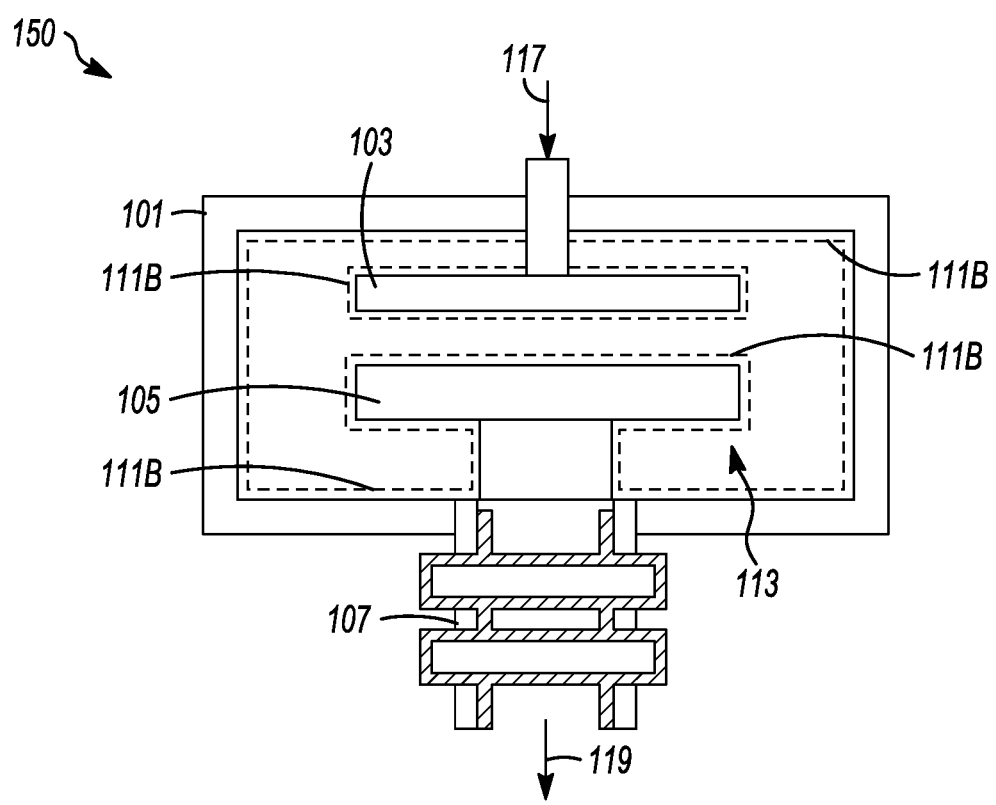
FIG. 1C shows results of a low-pressure clean on the interior portions of the single process-chamber using the plasma direct-cleaning system in accordance with FIG. 1A.
Figure 2A:
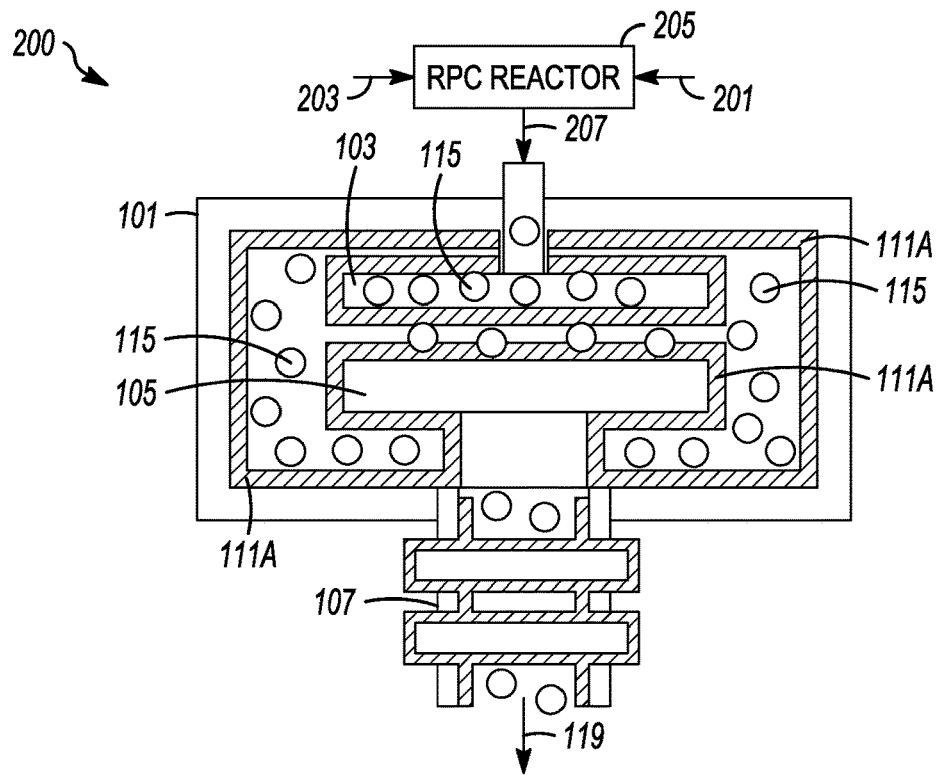
FIG. 2A shows a remote-plasma clean (RPC) system of the prior art used to clean interior portions of a single process-chamber.

For example, FIG. 2A shows a remote-plasma clean (RPC) system 200 of the prior art used to clean interior portions of the single process-chamber 101. The RPC system 200 is also shown to include an RPC reactor 205 into which a plasma 201, along with source gases 203, may be combined. The source gases (e.g., cleaning gases) may include, for example, nitrogen trifluoride ($NF_3$), carbon tetrafluoride ($CF_4$, also known as tetrafluoromethane), carbon hexafluoride ($C_2F_6$, also known as hexafluoroethane), octafluoropropane ($C_3F_8$, also known as perfluoropropane), and other fluorine-containing compounds, along with Argon (Ar) and/or oxygen ($O_2$).

As is known in the art, one or more radical species may be generated in the RPC reactor 205 and configured to enter the single process-chamber 101 via a gas inlet 207 couple to the single process-chamber 101 from the RPC reactor 205. Any type of plasma source may be used in the RPC reactor 205 to create the radical species. This includes, but is not limited to, capacitively coupled plasmas, microwave plasmas, DC plasmas, and laser-created plasmas. An example of a capacitively coupled plasma can be a radio frequency (RF)-generated plasma. A high-frequency plasma can be configured to operate at 13.56 MHz or higher. An example of such the RPC reactor 205 can comprise various products within the GAMMA® family (manufactured by Lam Research®, 4650 Cushing Parkway, Fremont, Calif. 94538, USA). Another example of the RPC reactor 205 known in the art is the ASTRON® ex reactive gas generator (manufactured by MKS Instruments, Inc., 2 Tech Drive, Andover, Mass. 01810, USA), which can be operated at 440 kHz. Additionally, a microwave plasma generator can be used as the RPC reactor 205, such as the ASTeX® (also manufactured by MKS Instruments, Inc.). A microwave plasma can be configured to operate at a frequency of 2.45 GHz. As explained below in greater detail, various embodiments of the disclosed subject matter may be used regardless of the type of reactor chosen. Various types of the RPC reactor 205 may be provided as a subunit mechanically coupled onto a larger apparatus used for processing one or more substrates in parallel.

Figure 2B:
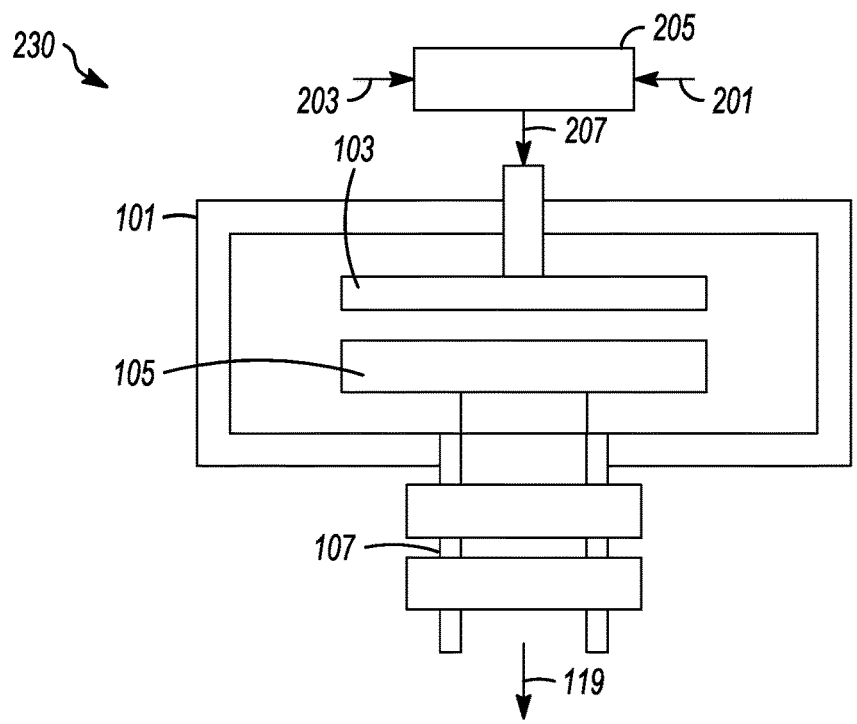
FIG. 2B shows results on the interior portions of the single process-chamber using the of the RPC system in accordance with FIG. 2A.

FIG. 2B shows results 230 on the interior portions of the single process-chamber using the of the RPC system 200 in accordance with FIG. 2A. The results indicate that each of the gas-distribution showerhead 103 and the pedestal 105 are free, or generally free, of any deposited materials (e.g., films). Therefore, the RPC process provides a substantially complete cleaning of interior portions of the single process-chamber 101. However, each of these prior art devices, as discussed in more detail below, is manufactured for use with only a single processing chamber. There is presently no effective way to deliver the radical species into multiple processing stations concurrently.

Figure 3:
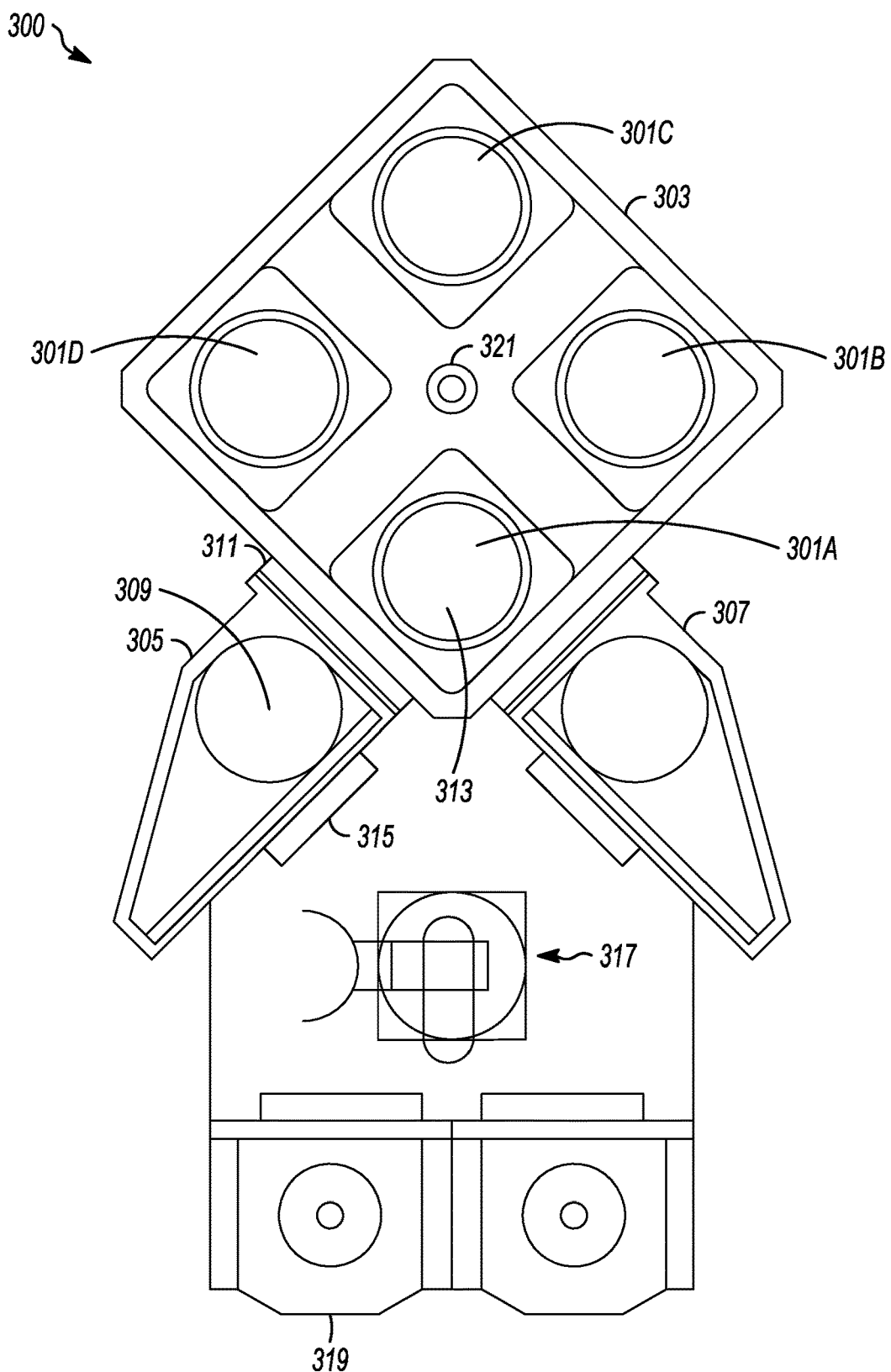
FIG. 3 shows a multi-station substrate-processing tool of the prior art.

For example, FIG. 3 shows a multi-station substrate-processing tool 300 of the prior art. However, although the multi-station substrate-processing tool 300 is known, similar or the same types of substrate-processing tool may be used with various embodiments of the disclosed subject matter as well.

The multi-station substrate-processing tool 300 includes a plurality of process stations 301A, 301B, 301C, 301D in a processing chamber 303. Although four stations are shown, a person of ordinary skill in the art will recognize that a larger or smaller number of stations may be used, along with appropriate changes. As is known to a skilled artisan, by maintaining each station in, for example, a low-pressure environment, defects caused by vacuum breaks between film-deposition processes may be reduced or avoided.

As is further shown in FIG. 3, the multi-station substrate-processing tool 300 includes a substrate inbound-load-lock 305 and a substrate outbound-load-lock 307, either or both of which may include a remote-plasma source (not shown but understandable to a person of ordinary skill in the art). A robot 317, generally at atmospheric pressure, is configured to move substrates from, for example, a cassette loaded through a substrate carrier 319 (e.g., such as a front-opening unified pod (FOUP) or other type of standard mechanical interface (SMIF)) into substrate inbound-load-lock 305 via an atmospheric port 315. A substrate is selected and placed by the robot 317 on a pedestal 309 in the substrate inbound-load-lock 305. The atmospheric port 315 is closed, and the load lock is pumped down to less than atmospheric pressure (e.g., a few Torr or less).

Where the substrate inbound-load-lock 305 includes a remote plasma source, the substrate may be exposed to a remote-plasma treatment in the load lock prior to being introduced into the processing chamber 303. Further, the substrate also may be heated in the substrate inbound-load-lock 305 to, for example, remove moisture and adsorbed gases. Next, a chamber transport port 311 to the processing chamber 303 is opened, and another robot (not shown) places the substrate into the processing chamber 303 on a pedestal 313 at the process station 301A. While the embodiment depicted in FIG. 3 includes load locks, it will be appreciated that, in some embodiments, direct entry of a wafer substrate into the processing chamber 303 may be provided.

As noted above, the processing chamber 303 shown in FIG. 3 provides four process stations, 301A, 301B, 301C, 301D. Process gases may be provided by a single, process-gas inlet 321. Further, each process station may have a heated pedestal (for example, the pedestal 313 for the process station 301A) and various gas line inlets (note shown). The multi-station substrate-processing tool 300 can also include a substrate-handling system for transferring substrates within the processing chamber 303 (e.g., from one of the process stations to another). Such types of substrate handling systems and related robotic mechanisms are known in the art. However, as noted above, there is presently no effective way to deliver the radical species into multiple processing stations concurrently.

Figure 4A:
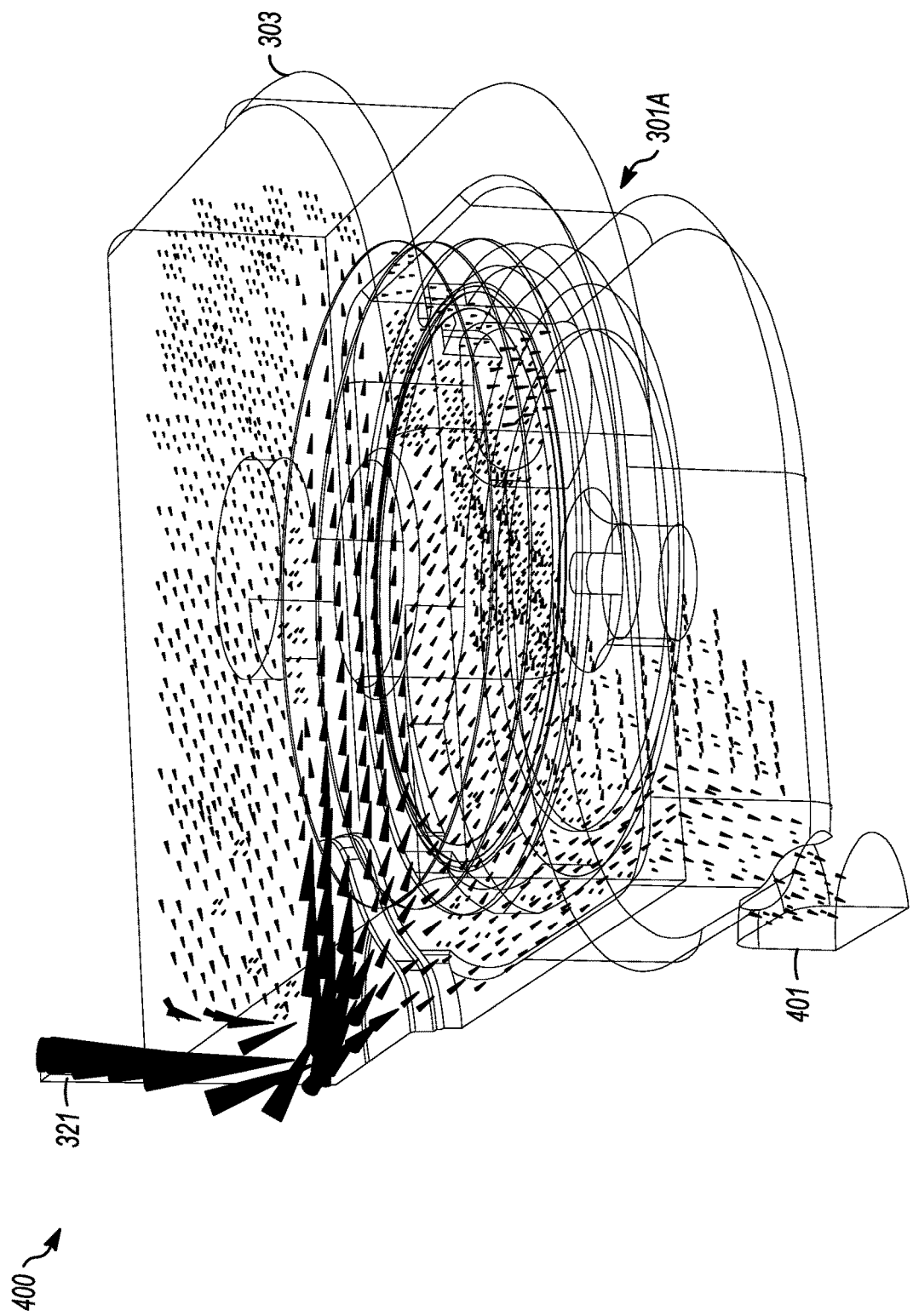
FIG. 4A shows a computational fluid dynamic (CFD)-based simulation showing a vector field of an RPC inlet flow of the prior art when applied to one station of the multi-station substrate-processing tool of FIG. 3.

FIG. 4A shows a computational fluid dynamic (CFD)-based simulation 400 showing a vector field of an RPC inlet flow of the prior art when applied to one station of the multi-station substrate-processing tool 300 of FIG. 3. As is known to a person of ordinary skill in the art conversant with CFD analysis, only a single process station is shown as results in remaining ones of the process stations (not shown) would be substantially identical in this situation as results would be mirrored along two axes (e.g., on the back edge and the left edge of the process station 301A).

A person of ordinary skill in the art will immediately recognize that the vectors are indicative of an extremely non-uniform velocity filed of the incoming RPC gases. For example, the vectors indicate a relative velocity of gases within the process station 301A of the processing chamber 303. At the single, process-gas inlet 321, the vectors are relatively large, indicating a high velocity of incoming gases including the radical species generated within, for example, the RPC reactor 205 of FIG. 2A. As the incoming gases containing the radical species move farther from the process-gas inlet 321 toward a facilities exhaust port 401, the vectors within the vector field are much smaller, thus indicating a lower velocity of the incoming gases. Due to the reduced velocity of the gases, there is also a concomitant reduction in efficacy of the radical species for cleaning.

Figure 4B:
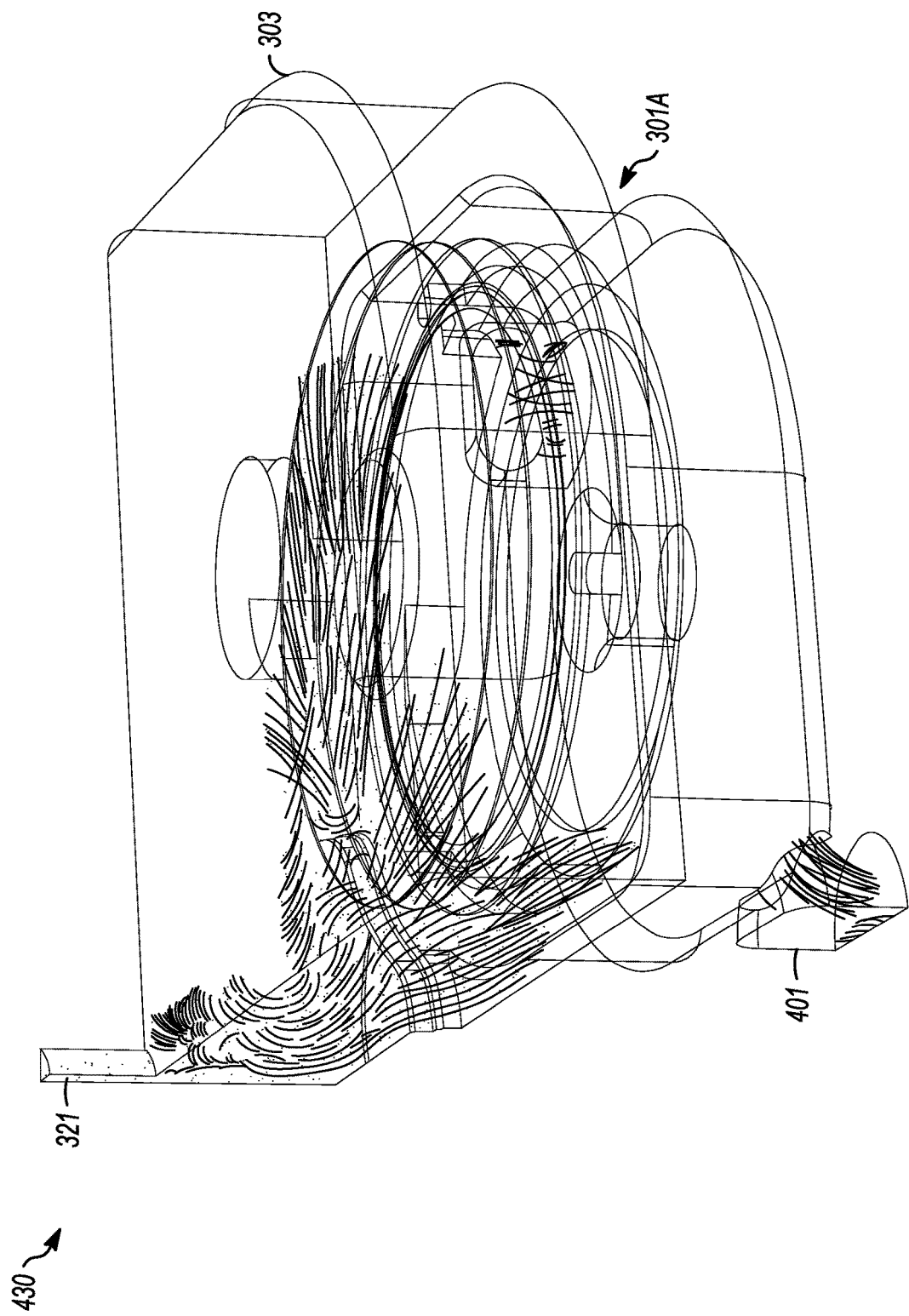
FIG. 4B shows a CFD-based simulation showing flow streams of an RPC inlet flow of the prior art when applied to one station of the multi-station of FIG. 3.

FIG. 4B shows a CFD-based simulation 430 showing flow streams of an RPC inlet flow of the prior art when applied to one station of the multi-station of FIG. 3. A person of ordinary skill in the art will recognize that the flow streams, much like the vector fields of FIG. 4A, are indicative of a lower-velocity of the incoming gases along with a reduction of the flow streams as the gases continue farther from the process-gas inlet 321.

The foregoing examples are provided merely as examples to offer the skilled artisan a context for the following disclosed subject matter and should not be considered as admitted prior art.

As an overview, various embodiments of the disclosed subject matter direct RPC gases, coming from an RPC gas-inlet, past a directional-flow device to between a gas-distribution showerhead and a substrate pedestal area within each process station. Although the following embodiments depict directional-flow devices used with four process stations, the actual number of process stations served by the various embodiments of the directional-flow device may be increased or decreased as needed for a given processing tool. For example, upon reading and understanding the disclosed subject matter, a person of ordinary skill in the art will recognize that the directional-flow devices described herein may be used with as few as two processing stations to six or more processing stations with relatively minor variations in the shapes of the directional-flow devices.

Figure 5:
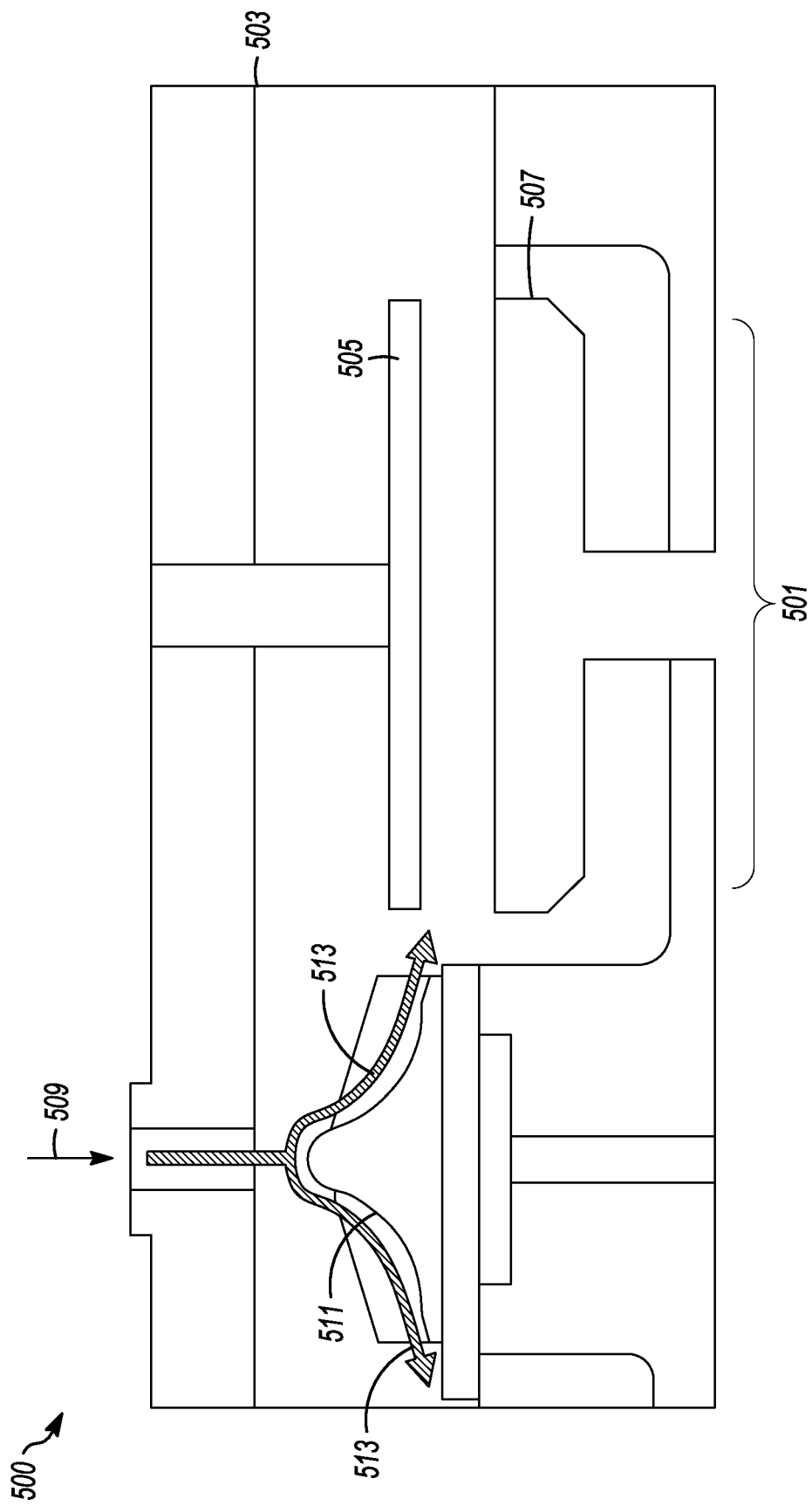
FIG. 5 shows a cross-section of one station of a multi-station substrate-processing tool using an RPC directional-flow device in accordance with an embodiment of the disclosed subject matter.

For example, with reference now to FIG. 5, a cross-section of one station 501 of a multi-station substrate-processing tool 500 using an RPC directional-flow device 511 in accordance with an embodiment of the disclosed subject matter is shown. FIG. 5 is shown to include a process chamber 503, which may include, for example, four processing chambers. Each processing station includes a gas-distribution showerhead 505 and a substrate pedestal 507 configured to hold a substrate (not shown in FIG. 5) undergoing processing. Although the RPC directional-flow device 511 is shown to direct the cleaning gases into areas between the gas-distribution showerhead 505 and the substrate pedestal 507, a person of ordinary skill in the art, upon reading and understanding the disclosed subject matter, will recognize that the cleaning gases can be directed into one more additional areas within the multi-station substrate-processing tool 500 as well. For example, the RPC directional-flow device 511 can be positioned to deliver the cleaning gases above the gas-distribution showerhead 505, between the gas-distribution showerhead 505 and the substrate pedestal 507 (as shown) and/or below the substrate pedestal 507 at different time periods during a cleaning cycle.

One or more radical species may be generated from various types of cleaning gases (e.g., fluorine-containing compounds as described above) in an RPC reactor (not shown but the reactor may the same as or similar to the RPC reactor 205 of FIG. 2A). The cleaning gases and the radical species enter the process chamber 503 of the multi-station substrate-processing tool 500 via a process-gas inlet 509 coupled to the multi-station substrate-processing tool 500 from the RPC reactor. The cleaning gases and the radical species are then split into substantially uniform flows 513 on either side of the RPC directional-flow device 511. (A person of ordinary skill in the art will recognize that the flow of cleaning gases is also substantially equally split in planes in front of and behind the given cross-sectional view as will become more apparent with regard to, for example, FIGS. 6A through 6C, described below).

Figure 6A:
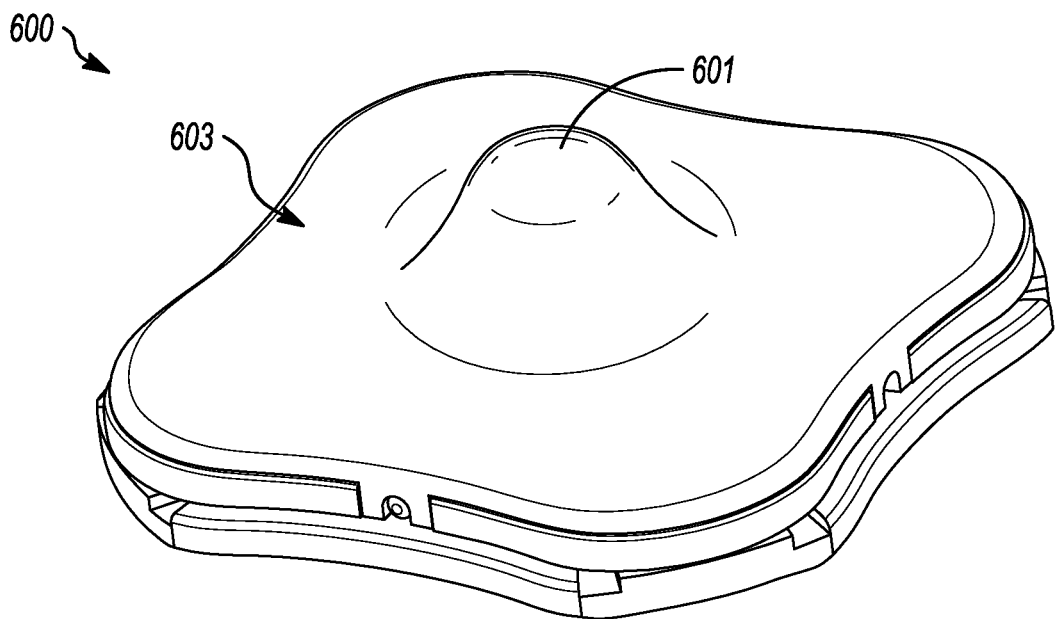
FIGS. 6A through 6C show various exemplary embodiments of an RPC directional-flow device in accordance the disclosed subject matter.
Figure 6B:
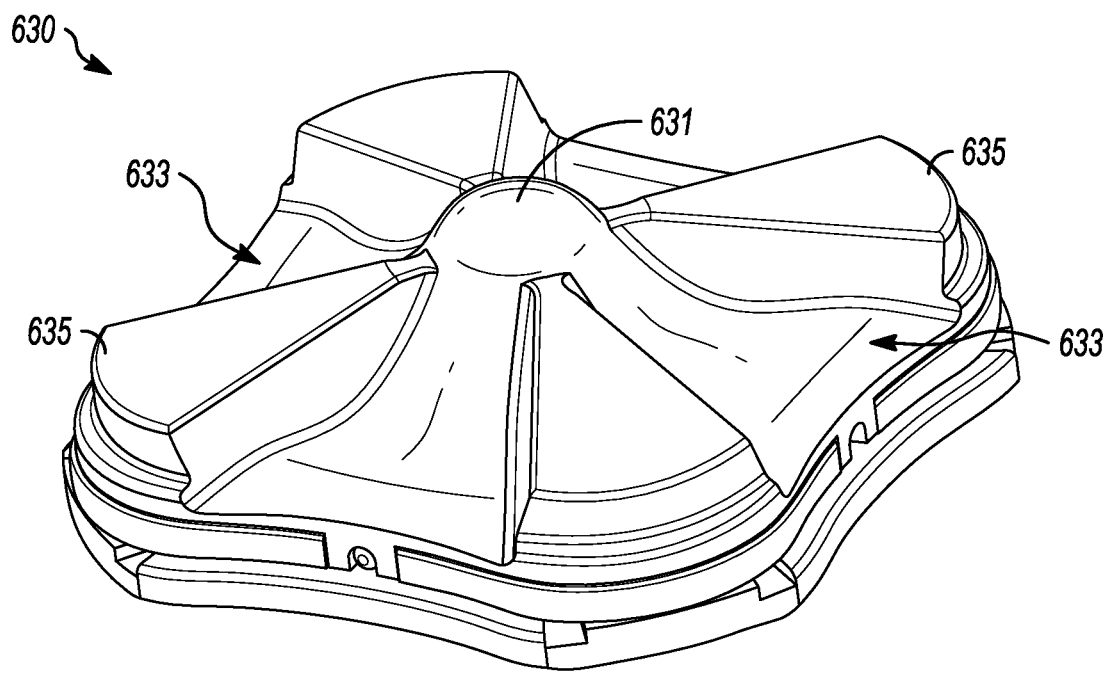
Figure 6C:
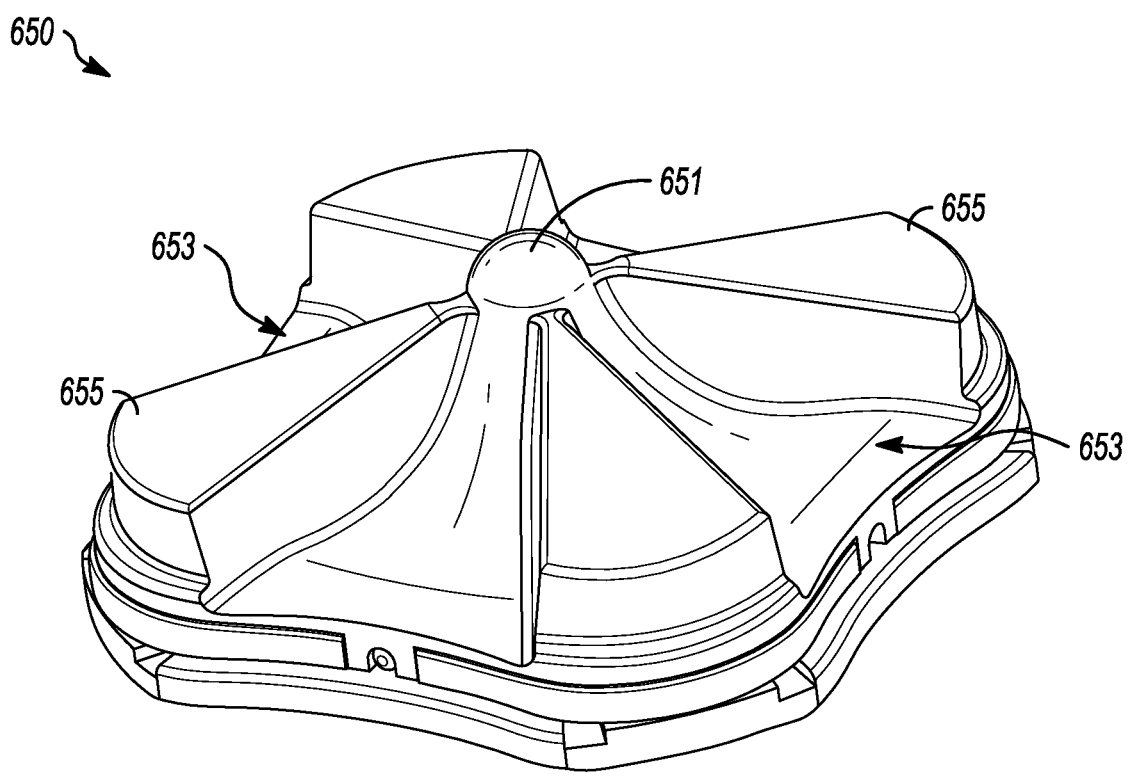

FIGS. 6A through 6C show various exemplary embodiments of an RPC directional-flow device in accordance the disclosed subject matter. For example, the embodiment of an RPC directional-flow device 600 of FIG. 6A is shown to include an incoming cleaning-gas diversion hub 601 (or generally, an incoming-gas diversion hub) surrounded by a substantially uniform ramped area 603. The skilled artisan will recognize that incoming cleaning gases will be split substantially uniformly in all directions after impinging on the incoming cleaning-gas diversion hub 601.

FIG. 6B is an embodiment that is shown to include an RPC directional-flow device 630 having an incoming cleaning-gas diversion hub 631. However, in contrast to the RPC directional-flow device 600 of FIG. 6A, the incoming cleaning-gas diversion hub 631 is surrounded by, in this example, four distinct, ramped gas-diversion areas 633 (four ramped gas-diversion areas). Each of the ramped gas-diversion areas 633 is separated from others of the ramped gas-diversion areas 633 by a raised wall 635. The raised walls 635 help to more fully separate and direct incoming cleaning gases and accompanying radical species into the ramped gas-diversion areas 633. Consequently, the skilled artisan will recognize that incoming cleaning gases will be split substantially uniformly into directions of the four distinct, ramped gas-diversion areas 633 after impinging on the incoming cleaning-gas diversion hub 631.

FIG. 6C is an embodiment that is shown to include an RPC directional-flow device 650 having an incoming cleaning-gas diversion hub 651. Each of a plurality of ramped gas-diversion areas 653 is separated from others of the ramped gas-diversion areas 653 by a raised wall 655. The raised walls 655 help to more fully separate and direct incoming cleaning gases and accompanying radical species into the ramped gas-diversion areas 653. Consequently, the skilled artisan will recognize that incoming cleaning gases will be split substantially uniformly into directions of the four distinct, ramped gas-diversion areas 653 after impinging on the incoming cleaning-gas diversion hub 651.

In contrast to the RPC directional-flow device 630 of FIG. 6B, the RPC directional-flow device 650 of FIG. 6C also includes a smaller (e.g., narrower) final exit-ramp of the ramped gas-diversion area 653. The final exit-ramp may be designed or optimized to deliver or focus the cleaning gases and accompanying radicals into specific areas, for example, between the gas-distribution showerhead 505 and the substrate pedestal 507 of FIG. 5.

A person of ordinary skill in the art will recognize that either of the RPC directional-flow devices 630, 650 of FIG. 6B or 6C, respectively, may have fewer than four or more than four distinct, ramped gas-diversion areas 633, 653 and accompanying one of the raised walls 635, 655.

Any of the RPC directional-flow devices 600, 630, 650 of FIG. 6A through FIG. 6C may be formed from, various materials including, for example, an ultra-high purity material such as various forms of aluminum, aluminum alloys, ceramic materials (such as, for example, aluminum oxide, $Al_2O_3$, and aluminum nitride, AlN), and other metallic (e.g., various grades of stainless steel) and non-metallic materials. Depending upon a particular use, other materials may also be used separately or in combination with the materials noted above. For example, in one specific exemplary embodiment, the RPC directional-flow devices 600, 630, 650 may be formed from a variety of high-performance alloys (also known as superalloys), known in the art. These high-performance alloys include, for example, Inconel® (available from different sources including Inco Alloys International, Inc., Huntington, W. Va., USA) or Hastelloy® (available from different sources including Haynes Stellite Company, Kokomo, Ind., USA and Union Carbide Corporation, New York, N.Y., USA). Such a material may be electropolished to, for example, a surface roughness value of Ra less than about, for example, 0.5 μm or less than about 0.1 μm, or even less depending upon a given process. In other embodiments, the RPC directional-flow devices 600, 630, 650 may be, for example, abrasive blasted, bead-blasted, or otherwise finished to have a surface texture to more fully disperse the cleaning gases and accompanying radicals. Further, a person of ordinary skill in the art, upon reading and understanding the disclosed subject matter, will recognize that the type of cleaning gas employed may also influence the type of material and the surface roughness or texture from which the RPC directional-flow devices 600, 630, 650 are formed. As noted above, various other materials may also be considered in combination with these high-performance alloys (e.g., such as aluminum, stainless steel, or other types of materials depending upon a particular application). Any of these materials may further be plated, coated, or otherwise have another type of coating (e.g., anodization) added.

Other materials to form the RPC directional-flow devices may also be considered. For example, materials that are at least somewhat resistant to etching from the cleaning gases employed may be considered. In certain applications, such materials should be able to withstand temperatures, without significant deformation, from about 250° C. up to about 550° C. at a temperature ramp rate of about 6° C./minute to about 10° C./minute. In various applications, a ramp rate of temperature may not be a consideration. In specific exemplary embodiments, the materials used to form the RPC directional-flow devices may have a face-flatness creep of less than about 100 μm (approximately 0.004 inches) for a minimum of 5 years. In various applications, creep or overall flatness may not be a consideration. In these applications, changes in creep or flatness will not affect the clean-gas flow.

Figure 7A:
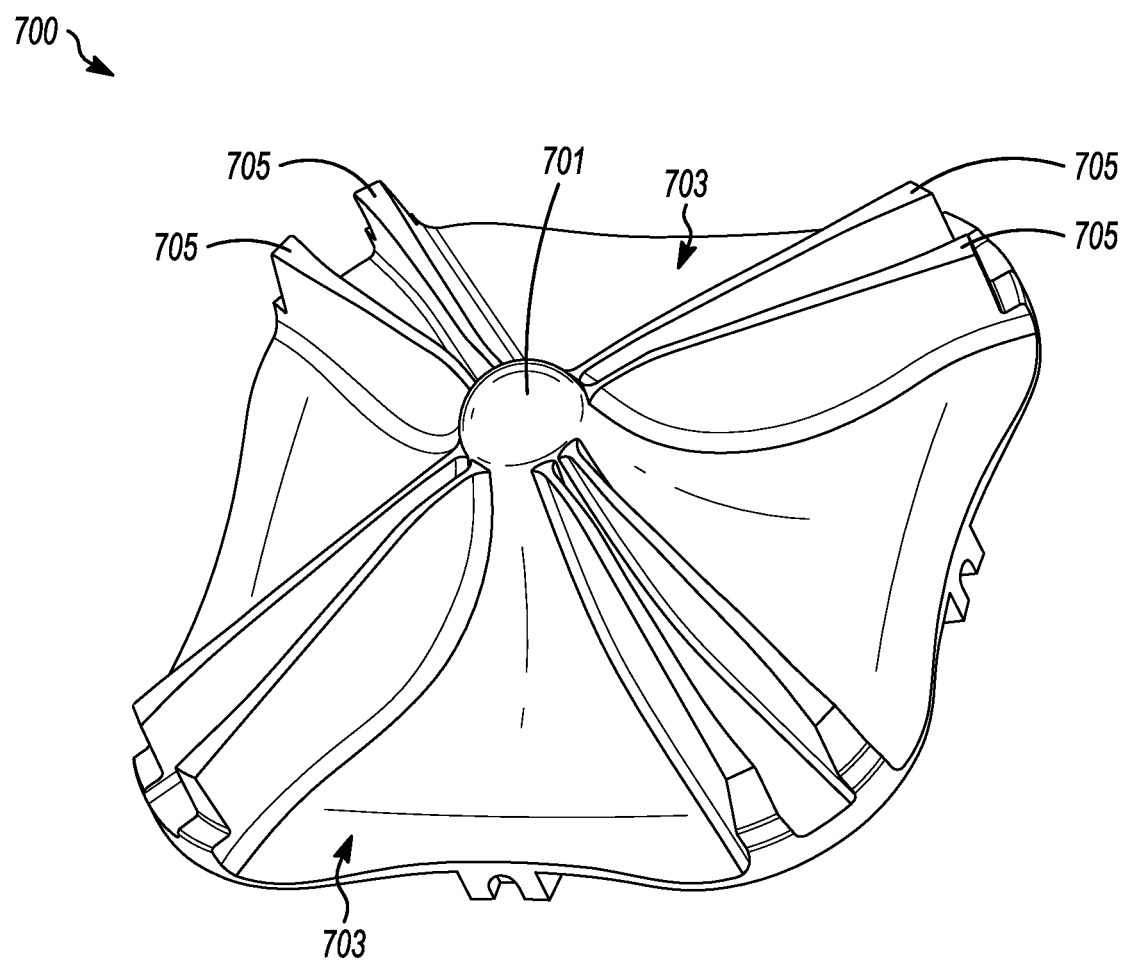
FIGS. 7A and 7B various exemplary embodiments of a multi-walled RPC directional-flow device in accordance the disclosed subject matter.
Figure 7B:
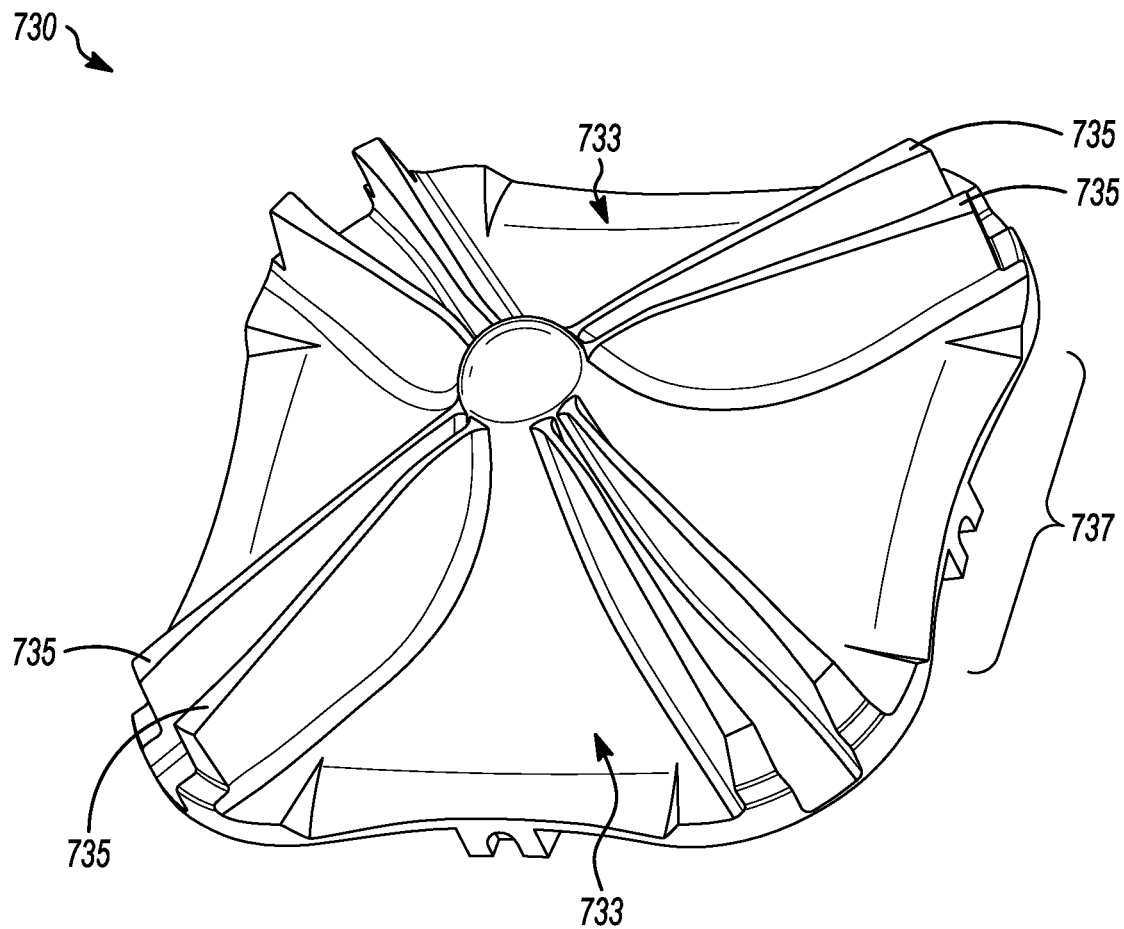

FIGS. 7A and 7B various exemplary embodiments of a multi-walled RPC directional-flow device in accordance the disclosed subject matter. For example, FIG. 7A shows an embodiment that includes a multi-walled RPC directional-flow device 700 having an incoming cleaning-gas diversion hub 701. The incoming cleaning-gas diversion hub 701 is surrounded by, in this example, four distinct, ramped gas-diversion areas 703. Each of the ramped gas-diversion areas 703 is separated from others of the ramped gas-diversion areas 703 by a multi-ribbed wall 705. The multi-ribbed walls 705 help to more fully separate and direct incoming cleaning gases and accompanying radical species into the ramped gas-diversion areas 703. Consequently, the skilled artisan will recognize that incoming cleaning gases will be split substantially uniformly into directions of the four distinct, ramped gas-diversion areas 703 and into the four distinct areas between the multi-ribbed wall 705 portions after impinging on the incoming cleaning-gas diversion hub 701 (e.g., a total of eight distinct areas or channels into which gas can flow; eight ramped gas-diversion areas).

With reference now to FIG. 7B, an embodiment that includes a multi-walled RPC directional-flow device 730 having an incoming cleaning-gas diversion hub 731 is shown. The incoming cleaning-gas diversion hub 731 is surrounded by, in this example, four distinct, ramped gas-diversion areas 733. Each of the ramped gas-diversion areas 733 is separated from others of the ramped gas-diversion areas 733 by a multi-ribbed wall 735. The multi-ribbed walls 735 help to more fully separate and direct incoming cleaning gases and accompanying radical species into the ramped gas-diversion areas 733. Consequently, the skilled artisan will recognize that incoming cleaning gases will be split substantially uniformly into directions of the four distinct, ramped gas-diversion areas 733 and into the four distinct areas between the multi-ribbed wall 735 portions after impinging on the incoming cleaning-gas diversion hub 731 (e.g., a total of eight distinct areas or channels into which gas can flow; eight ramped gas-diversion areas).

In various embodiments, the various directional-flow devices having the four additional channels (e.g., the four distinct areas between the multi-ribbed wall 705, 735 portions) allows the directional-flow devices to direct cleaning of raised ribs in the process chamber that form pockets, or other areas around the pedestal as shown in, for example, FIG. 5.

In contrast to the multi-walled RPC directional-flow device 700 of FIG. 7A, the multi-walled RPC directional-flow device 730 of FIG. 7B also includes a smaller (e.g., narrower) exit-ramp area 737. The exit-ramp area 737 may be designed or optimized to deliver or focus the cleaning gases and accompanying radicals into specific areas, for example, between the gas-distribution showerhead 505 and the substrate pedestal 507 of FIG. 5.

Each of the multi-walled RPC directional-flow device 700, 730 may be constructed using the same or similar materials, or combinations of materials, as discussed with regard to FIGS. 6A through 6C, above. Further, the multi-ribbed walls 705, 735 of FIGS. 7A and 7B can act as heat sinks and may provide more effective cooling (both thermally conductive and thermally convective due to the increased area of the multi-ribbed walls 705, 735 as compared with the raised walls 635, 655 of FIGS. 6B and 6C. This cooling function provided by the multi-ribbed walls 705, 735 may be advantageous in certain applications. In other applications, the multi-ribbed walls 705, 735 may be heated (e.g., from a bottom side by techniques known in the art) to reduce or prevent recombination effects of a cleaning-gas species.

Figure 8A:
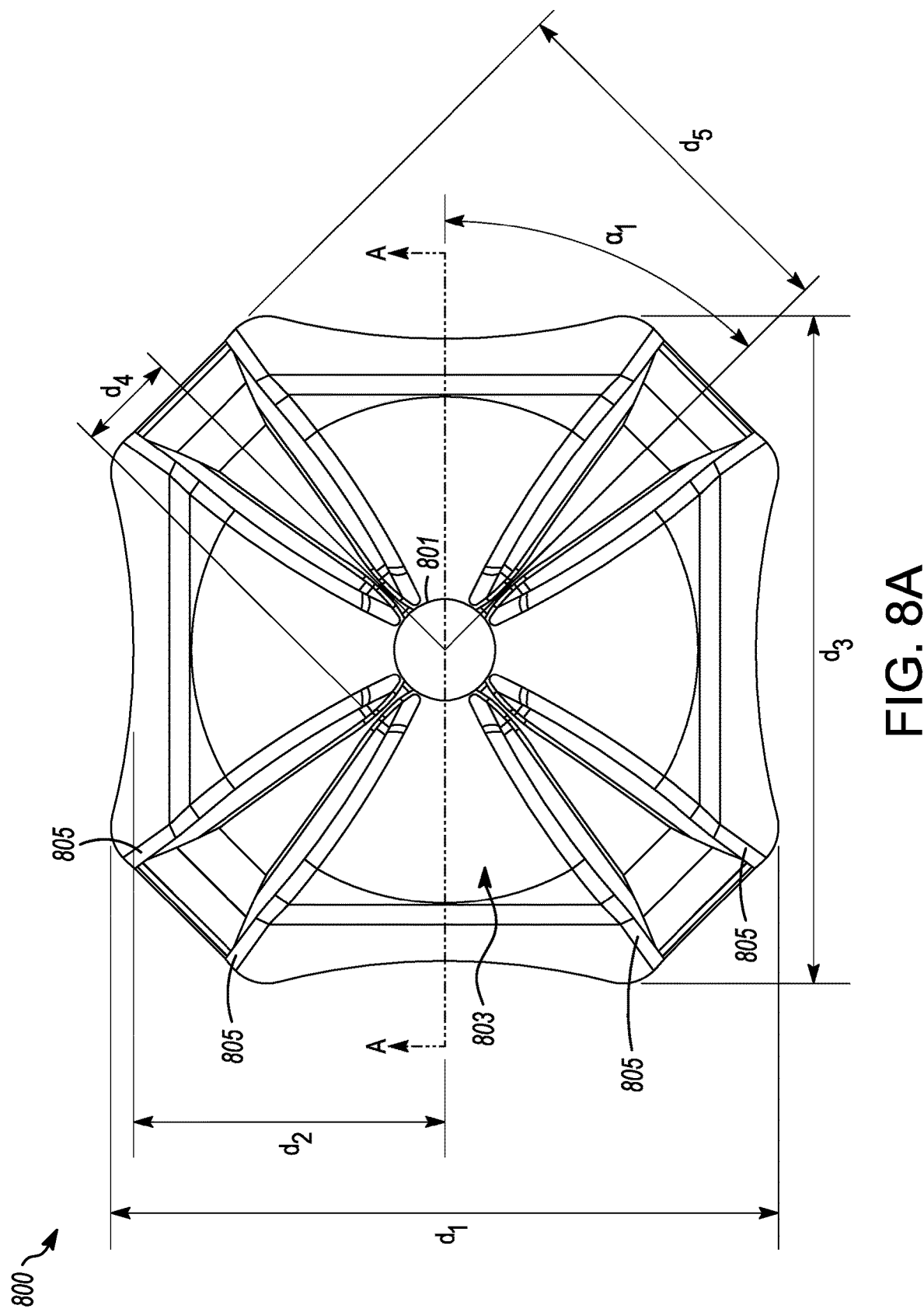
FIGS. 8A and 8B show exemplary physical dimensions for the multi-walled RPC directional-flow devices of FIGS. 7A and 7B.
Figure 8B:
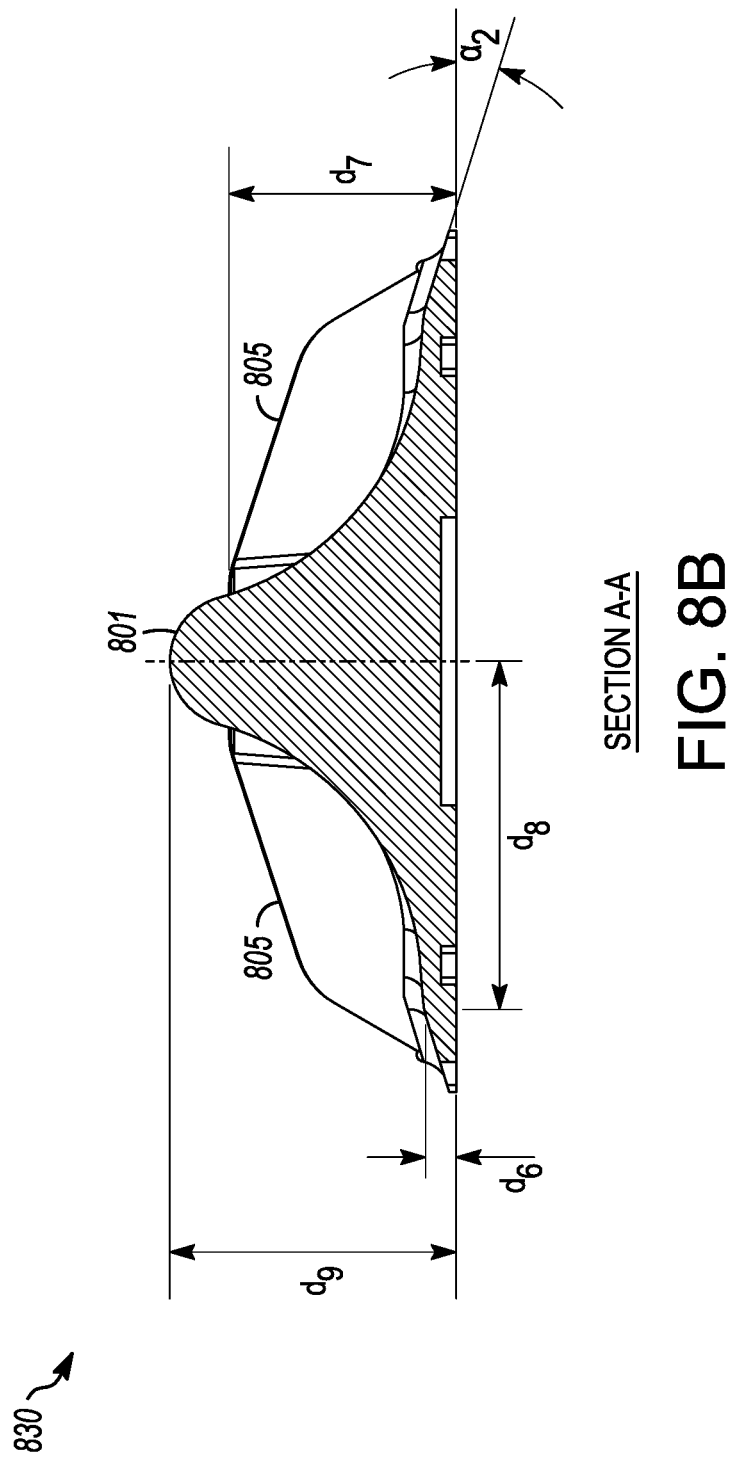

FIGS. 8A and 8B show exemplary physical dimensions for the multi-walled RPC directional-flow devices of FIGS. 7A and 7B. These physical dimensions are provided as examples only to help a person of ordinary skill in the art better understand the disclosed subject matter. However, upon reading and understanding the disclosed subject matter, the person of ordinary skill in the art will recognize that the physical dimensions can change significantly based on a size of the various process stations (e.g., whether the stations are designed to accommodate 300 mm or 450 mm round substrates, square or rectangular flat-panel displays, flow-rates and pressures encountered within the processing stations, physical separations between components within the processing station, a total number of processing stations, and a number of other factors). Therefore, the physical dimensions provided herein are exemplary only.

For example, FIG. 8A shows a plan view 800 of a multi-walled RPC directional-flow device that may be the same as or similar to the multi-walled RPC directional-flow device of FIGS. 7A and 7B. FIG. 8A is shown to include an incoming cleaning-gas diversion hub 801 surrounded by, in this example, four distinct, ramped gas-diversion areas 803. Each of the ramped gas-diversion areas 803 is separated from others of the ramped gas-diversion areas 803 by a multi-ribbed wall 805. Although the incoming cleaning-gas diversion hub 801 is shown as being substantially dome-shaped (e.g., a convex geometry) and without particular dimensions, a person of ordinary skill in the art will recognize that shapes other than dome shaped and implied radii of the incoming cleaning-gas diversion hub 801 (or any of the other incoming cleaning-gas diversion hubs 601, 631, 651, 701, 731) may be used. For example, a shape and dimensions (e.g., an interior radius of the incoming cleaning-gas diversion hub may be determined for a given application, types of gases, and physical properties of the gases (e.g., gas viscosities, flowrates of the gases, etc.). These shape and dimensions designs may be determined by various techniques such as through empirical techniques or through CFD analysis, or a combination of the two techniques. The person of ordinary skill in the art will recognize how the shape and dimensions may be determined based upon reading and understanding the disclosed subject matter.

The exemplary physical dimensions include an overall first width, $d_1$, of about 241 mm (approximately 9.5 inches), a distance from a centerline of the multi-walled RPC directional-flow device to a side indentation, $d_2$, of about 112.8 mm (approximately 4.44 inches), an overall second width $d_3$, of about 241 mm (approximately 9.5 inches), a distance from another centerline of the multi-walled RPC directional-flow device to an upper portion of the multi-ribbed wall 805, $d_4$, of about 35.6 mm (approximately 1.4 inches), and a distance from another centerline of the multi-walled RPC directional-flow device to an outermost portion of the ramped gas-diversion areas 803 $d_5$, of about 135.9 mm (approximately 5.35 inches). A first angle, $\square_1$, from a centerline of the multi-walled RPC directional-flow device (between the ribs of the multi-ribbed wall 805) is about 45°. FIG. 8A also shows a cross-section A-A described with regard to FIG. 8B, below.

With reference now to FIG. 8B, an elevation view 830 of the of the multi-walled RPC directional-flow device of FIG. 8A is shown. FIG. 8B shows the cross-section of FIG. 8A at A-A. The exemplary physical dimensions include an overall height, $d_9$, of about 80.0 mm (approximately 3.15 inches), and a distance from the centerline of the multi-walled RPC directional-flow device to a top of the exit-ramp area (e.g., the exit-ramp area 737 of FIG. 7B) of about 96.5 mm (approximately 3.8 inches). An exemplary distance from a top portion of the exit-ramp area to a bottommost portion of the multi-walled RPC directional-flow device is shown to be about 9.91 mm (approximately 0.39 inches) and a height from the bottommost portion of the multi-walled RPC directional-flow device to a top of the multi-ribbed wall 805 is about 63.5 mm (approximately 2.5 inches). An exemplary angle, $\square_2$, of the exit-ramp area is about 16.7°.

Any of the RPC directional-flow devices (e.g., those shown in FIGS. 6A through 6C and in FIGS. 7A and 7B) described above may be internally cooled (e.g., by water cooling or cooling by another fluid, such as, for example, helium) to maintain an approximate desired temperature of the RPC directional-flow devices. Although not shown, cooling fins may be added on internal surfaces of the devices to act as heat sinks that are convectively cooled by a flowing liquid or other fluid passed thereby. In other embodiments, cooling fins may be formed on internal surfaces of the RPC directional-flow devices in a spiral path to enhance convective cooling from the devices due to the flowing liquid. In still other embodiments, similar types of internal cooling fins may be formed on internal surface of the RPC directional-flow devices to be convectively cooled by a gas passing thereby. Such a gas can be chosen to have a high specific heat-capacity, such as helium (He).

In a specific exemplary embodiment, the RPC cleaning gases may be flowing at, for example, about 12 standard liters per minute (slpm) at a pressure of about 3 Torr. In other embodiments, the RPC cleaning gases may be flowing at, for example, about 27.5 slpm at a pressure of about 3 Torr. In still other embodiments, the cleaning gases may be flowing at flowrates less than about 12 slpm or above about 27.5 slpm. In various embodiments, the cleaning gases may be injected into the process chamber that are at pressures lower than about 3 Torr or higher than about 3 Torr.

Figure 9A:
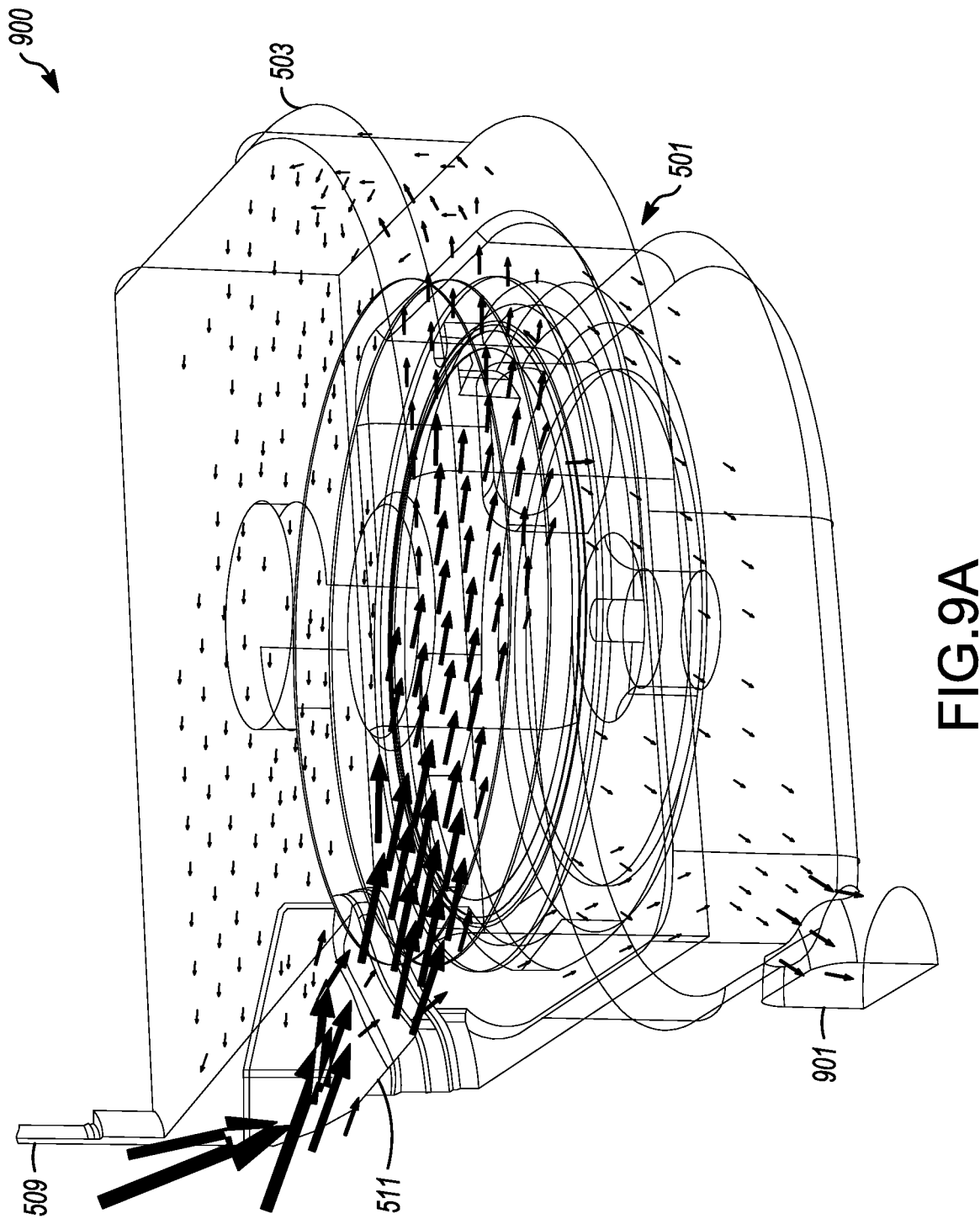
FIG. 9A shows a CFD-based simulation showing a vector field of an RPC inlet flow using an RPC directional-flow device in accordance the disclosed subject matter when applied to one station of a multi-station substrate-processing tool.

With concurrent reference to FIG. 5, FIG. 9A shows a CFD-based simulation 900 showing a vector field of an RPC inlet flow using an RPC directional-flow device in accordance the disclosed subject matter when applied to one station of a multi-station substrate-processing tool. As discussed above with reference to FIGS. 4A and 4B, and as is known to a person of ordinary skill in the art conversant with CFD analysis, only a single process station is shown as results in remaining ones of the process stations (not shown) would be substantially identical in this situation as results would be mirrored along two axes (e.g., on the back edge and the left edge of the process station).

A person of ordinary skill in the art will immediately recognize that the vectors of FIG. 9A are indicative of a substantially-uniform velocity filed of the incoming RPC gases. For example, the vectors indicate a relative velocity of gases within the process-gas inlet 509 of the process chamber 503. After the gases and radical species enter the process-gas inlet 509 and are directed to a space between the gas-distribution showerhead 505 and the substrate pedestal 507 (see FIG. 5) toward a facilities exhaust-port 901, the vectors are relatively uniform, especially when compared with the CFD simulations 400, 430 of FIGS. 4A and 4B. Due to the substantial-uniformity, as indicated by the velocity of the gases and radical species, there is also relatively high efficacy of the radical species for cleaning.

Figure 9B:
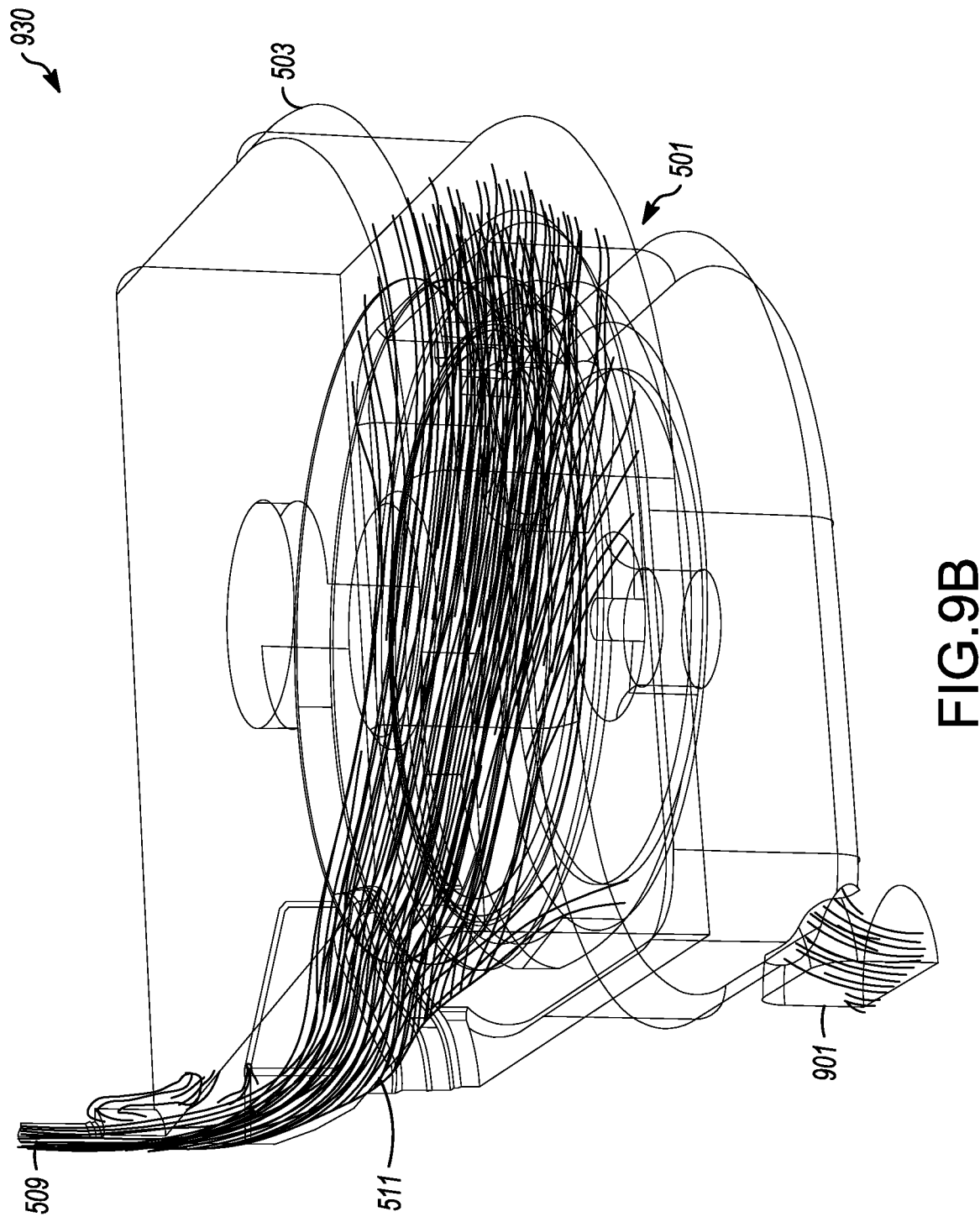
FIG. 9B shows a CFD-based simulation showing flow streams of an RPC inlet flow using an RPC directional-flow device in accordance the disclosed subject matter when applied to one station of a multi-station substrate-processing tool.

With continuing reference to FIG. 5, FIG. 9B shows a CFD-based simulation 930 showing flow streams of an RPC inlet flow using an RPC directional-flow device in accordance the disclosed subject matter when applied to one station of a multi-station substrate-processing tool. A person of ordinary skill in the art will recognize that the flow streams, much like the vector fields of FIG. 9A, are indicative of a substantially-uniform velocity of the incoming gases along across the space between the gas-distribution showerhead 505 and the substrate pedestal 507 (see FIG. 5) toward the facilities exhaust-port 901.

In the examples of FIGS. 9A and 9B, the CFD-based simulations 900, 930 were run considering an incoming flowrate of the cleaning gas to be about 27.5 slpm (or about 6.875 slpm per station, that is (27.5 slpm)/4) at a pressure of about 3 Torr. The space between a bottommost portion of the gas-distribution showerhead and an uppermost portion of the substrate pedestal is about 24.6 mm. A large number of other CFD simulations were run using various other parameters as well.

Throughout this specification, plural instances may implement components, operations, or structures described as a single instance. Although individual operations of one or more methods are illustrated and described as separate operations, one or more of the individual operations may be performed concurrently, and nothing requires that the operations necessarily be performed in the order illustrated. Structures and functionality presented as separate components in example configurations may be implemented as a combined structure or component. Similarly, structures and functionality presented as a single component (e.g., various embodiments of the RPC directional-flow device) may be implemented as separate components. These and other variations, modifications, additions, and improvements fall within the scope of the subject matter described herein.

Further, as used herein, the term "or" may be construed in an inclusive or exclusive sense. Further, other embodiments will be understood by a person of ordinary skill in the art upon reading and understanding the disclosure provided. Additionally, upon reading and understanding the disclosure, the person of ordinary skill in the art will readily understand that various combinations of the techniques and examples provided herein may all be applied in various combinations.

Although various embodiments are discussed separately, these separate embodiments are not intended to be considered as independent techniques or designs. As indicated above, each of the various portions may be inter-related and each may be used separately or in combination with other embodiments of the RPC directional-flow devices discussed herein. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Functionally equivalent methods and devices within the scope of the disclosure, in addition to those enumerated herein, will be apparent to the skilled artisan from the foregoing descriptions. Portions and features of some embodiments may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to ascertain quickly the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

THE FOLLOWING NUMBERED EXAMPLES INCLUDE EMBODIMENTS OF THE DISCLOSED SUBJECT MATTER

Example 1: In an embodiment, the disclosed subject matter includes an apparatus to direct radical species is disclosed. The apparatus comprises a remote-plasma clean (RPC) directional-flow device that is configured to be coupled between an RPC reactor and a multi-station process chamber. The RPC directional-flow device includes multiple, ramped gas-diversion areas. Respective ones of the multiple, ramped gas-diversion areas are configured to direct at least the radical species generated by the RPC reactor to a separate one of multiple processing stations within the multi-station process chamber. A number of the ramped gas-diversion areas is at least equal to a number of the multiple processing stations. An incoming cleaning-gas diversion hub is arranged to receive at least the radical species from the RPC reactor and distribute at least the radical species substantially-uniformly to each of the multiple, ramped gas-diversion areas.

Example 2: The apparatus of Example 1, wherein the RPC directional-flow device comprises four ramped gas-diversion areas.

Example 3: The apparatus of Example 1, wherein the RPC directional-flow device comprises eight ramped gas-diversion areas.

Example 4: The apparatus of any one of the preceding Examples, further comprising an exit-ramp area formed near an outer periphery of the RPC directional-flow device, the exit-ramp area being narrower than the ramped gas-diversion area in which the exit-ramp area is formed.

Example 5: The apparatus of any one of the preceding Examples, further including a multi-ribbed wall separating each of the ramped gas-diversion areas. The apparatus also includes a channel located between each multi-ribbed wall separating the ramped gas-diversion areas to direct at least the radical species generated by the RPC reactor.

Example 6: The apparatus of any one of the preceding Examples, wherein the incoming cleaning-gas diversion hub is substantially dome-shaped.

Example 7: The apparatus of any one of the preceding Examples, wherein the RPC directional-flow device is positioned to direct at least the radical species above each of multiple gas-distribution showerheads in the multi-station process chamber.

Example 8: The apparatus of any one of the preceding Examples, wherein the RPC directional-flow device is positioned to direct at least the radical species between each of multiple gas-distribution showerheads and respective multiple substrate pedestals in the multi-station process chamber.

Example 9: The apparatus of any one of the preceding Examples, wherein the RPC directional-flow device is positioned to direct at least the radical species below each of multiple substrate pedestals in the multi-station process chamber.

Example 10: In an embodiment, a directional-flow device to distribute an incoming-gas flow is disclosed. The directional-flow device includes multiple, ramped gas-diversion areas. Respective ones of the multiple, ramped gas-diversion areas are arranged to direct the incoming-gas flow to a separate one of multiple processing stations within a multi-station process chamber. A number of the ramped gas-diversion areas is at least equal to a number of the multiple processing stations. An incoming-gas diversion hub is arranged to receive and split the incoming-gas flow substantially-uniformly and distribute the incoming-gas flow to at least each of the multiple ramped gas-diversion areas.

Example 11: The apparatus of Example 10, wherein the directional-flow device comprises four ramped gas-diversion areas.

Example 12: The apparatus of Example 10, wherein the RPC directional-flow device comprises eight ramped gas-diversion areas.

Example 13: The apparatus of any one of Example 10 through Example 12, wherein the incoming-gas diversion hub is substantially dome-shaped.

Example 14: In an embodiment, a remote-plasma clean (RPC) directional-flow device is disclosed. The RPC directional-flow device includes multiple, ramped gas-diversion areas. Respective ones of the multiple, ramped gas-diversion areas are configured to direct at least a radical species generated by an RPC reactor to a separate one of multiple processing stations within a multi-station process chamber. A multi-ribbed wall separates each of the ramped gas-diversion areas. The multi-ribbed wall has a channel located between each multi-ribbed wall separating the ramped gas-diversion areas. An incoming cleaning-gas diversion hub is arranged to receive at least the radical species from the RPC reactor and distribute at least the radical species substantially-uniformly to each of the multiple, ramped gas-diversion areas.

Example 15, the RPC directional-flow device of Example 14, wherein a number of the multiple, ramped gas-diversion areas is at least equal to a number of the multiple processing stations.

Example 16, the RPC directional-flow device of either Example 14 or Example 15, wherein a number of the channels is at least equal to a number of the multiple processing stations.

Example 17, the RPC directional-flow device of any one of Example 14 through Example 16, wherein the incoming cleaning-gas diversion hub is substantially dome-shaped.

Example 18, the RPC directional-flow device of any one of Example 14 through Example 17, wherein the RPC directional-flow device is positioned within the multi-station process chamber to direct at least the radical species above each of multiple gas-distribution showerheads in the multi-station process chamber.

Example 19, the RPC directional-flow device of any one of Example 14 through Example 18, wherein the RPC directional-flow device is positioned within the multi-station process chamber to direct at least the radical species between each of multiple gas-distribution showerheads and respective multiple substrate pedestals in the multi-station process chamber.

Example 20, the RPC directional-flow device of any one of Example 14 through Example 18, wherein the RPC directional-flow device is positioned within the multi-station process chamber to direct at least the radical species below each of multiple substrate pedestals in the multi-station process chamber.

What is claimed is:

1. An apparatus for use in semiconductor processing, the apparatus comprising:
a remote-plasma directional-flow device that is configured to be coupled between a remote-plasma reactor and a multi-station process chamber having a plurality of processing stations, the remote-plasma directional-flow device comprising:
a plurality of ramped gas-diversion areas, respective ones of the plurality of ramped gas-diversion areas configured to direct at least radical species generated by the remote-plasma reactor to a separate one of the plurality of processing stations within the multi-station process chamber, a number of the plurality of ramped gas-diversion areas being equal to or greater than a number of the plurality of processing stations;
a raised wall that separates each of the ramped gas-diversion areas; and
an incoming gas diversion hub connected to each of the plurality of ramped gas-diversion areas, wherein the incoming gas diversion hub is configured to receive at least the radical species from the remote-plasma reactor and distribute at least the radical species substantially-uniformly to each of the plurality of ramped gas-diversion areas, wherein each of the plurality of ramped gas-diversion areas comprises a first section connected to the incoming gas diversion hub and a second section connected to the first section, wherein the first section is sloped downwards in a non-linear profile and the second section is sloped downwards in a linear profile.

2. The apparatus of claim 1, wherein the remote-plasma directional-flow device comprises four ramped gas-diversion areas.

3. The apparatus of claim 1, wherein the remote-plasma directional-flow device comprises eight ramped gas-diversion areas.

4. The apparatus of claim 1, further comprising an exit-ramp area near an outer periphery of the remote-plasma directional-flow device, the exit-ramp area being narrower than the ramped gas-diversion area in which the exit-ramp area is located.

5. The apparatus of claim 1, further comprising:
a channel located between portions of each raised wall to form a multi-ribbed wall, wherein the channel is configured to direct at least the radical species generated by the remote-plasma reactor.

6. The apparatus of claim 1, wherein the incoming gas diversion hub is substantially dome-shaped.

7. The apparatus of claim 1, wherein the remote-plasma directional-flow device is positioned to direct at least the radical species above each of multiple gas-distribution showerheads in the multi-station process chamber.

8. The apparatus of claim 1, wherein the remote-plasma directional-flow device is positioned to direct at least the radical species between each of multiple gas-distribution showerheads and respective multiple substrate pedestals in the multi-station process chamber.

9. The apparatus of claim 1, wherein the remote-plasma directional-flow device is positioned to direct at least the radical species below each of multiple substrate pedestals in the multi-station process chamber.

10. A directional-flow device to distribute an incoming-gas flow, the directional-flow device comprising:
a gas diversion hub having a top surface with a convex geometry;
a plurality of ramped gas-diversion areas intersecting the top surface of the gas diversion hub and arranged around the gas diversion hub, wherein each of the plurality of ramped gas-diversion areas comprises a first section connected to the top surface of the gas diversion hub and a second section connected to the first section, wherein the first section has a concave geometry, wherein the first section is sloped downwards in a non-linear profile and the second section is sloped downwards in a linear profile; and
a plurality of raised walls that separate the plurality of the ramped gas-diversion areas from each other.

11. The directional-flow device of claim 10, wherein the directional-flow device comprises four ramped gas-diversion areas.

12. A remote-plasma clean (RPC) directional-flow device, comprising:
a plurality of ramped gas-diversion areas, respective ones of the plurality of ramped gas-diversion areas being configured to direct at least radical species generated by an RPC reactor to a separate one of a plurality of processing stations within a multi-station process chamber;
a multi-ribbed wall separating each of the ramped gas-diversion areas; and
an incoming cleaning-gas diversion hub connected to each of the plurality of ramped gas-diversion areas, wherein the incoming cleaning-gas diversion hub is configured to receive at least the radical species from the RPC reactor and distribute at least the radical species substantially-uniformly to each of the plurality of ramped gas-diversion areas, wherein each of the plurality of ramped gas-diversion areas comprises a first section connected to the incoming cleaning-gas diversion hub and a second section connected to the first section, wherein the first section is sloped downwards in a non-linear profile and the second section is sloped downwards in a linear profile.

13. The RPC directional-flow device of claim 12, wherein a number of the plurality of ramped gas-diversion areas is equal to or greater than a number of the plurality of processing stations.

14. The RPC directional-flow device of claim 12, further comprising:
a plurality of channels, each of the plurality of channels located between portions of the multi-ribbed wall, wherein the plurality of channels are configured to direct at least the radical species generated by the RPC reactor, wherein a number of the channels is equal to or greater than a number of the plurality of processing stations.

15. The RPC directional-flow device of claim 12, wherein the incoming cleaning-gas diversion hub is substantially dome-shaped.

16. The RPC directional-flow device of claim 12, wherein the RPC directional-flow device is positioned within the multi-station process chamber to direct at least the radical species above each of multiple gas-distribution showerheads in the multi-station process chamber.

17. The RPC directional-flow device of claim 12, wherein the RPC directional-flow device is positioned within the multi-station process chamber to direct at least the radical species between each of multiple gas-distribution showerheads and respective multiple substrate pedestals in the multi-station process chamber.

18. The RPC directional-flow device of claim 12, wherein the RPC directional-flow device is positioned within the multi-station process chamber to direct at least the radical species below each of multiple substrate pedestals in the multi-station process chamber.

19. An apparatus for use in semiconductor processing, the apparatus comprising:
a gas directional-flow device comprising:
 a gas diversion hub having a curved top surface;
 a plurality of ramped gas diversion areas intersecting the curved top surface and symmetrically arranged about the gas diversion hub, wherein each of the plurality of ramped gas diversion areas comprises a first section connected to the curved top surface and a second section connected to the first section, wherein the first section is sloped downwards in a first profile from the curved top surface towards an outer periphery of the gas directional-flow device, wherein the second section is sloped downwards in a second profile different than the first profile, wherein the first profile is a non-linear profile and the second profile is a linear profile; and
a raised wall that separates each of the ramped gas diversion areas.

20. The apparatus of claim 19, wherein the curved top surface is substantially dome-shaped.

21. The apparatus of claim 19, wherein the curved top surface has a convex geometry and the first profile of the first section has a concave geometry.

22. The apparatus of claim 19, wherein an initial slope of the first profile adjacent to the curved top surface of gas diversion hub is steeper than a terminal slope of the first profile adjacent to the second section of the ramped gas diversion areas.

23. The apparatus of claim 22, wherein the second section of the ramped gas diversion area defines an exit-ramp area having an exit-ramp slope, wherein the exit-ramp slope is steeper than the terminal slope of the first profile.

24. The apparatus of claim 23, wherein the exit-ramp slope has an angle of approximately 16.7°.

25. The apparatus of claim 19, wherein the first section expands in width from the curved top surface to the second section.

26. The apparatus of claim 19, wherein the second section of the ramped gas diversion area defines an exit-ramp area, the exit-ramp area being narrower in width than a terminal end of the first section.

* * * * *